(12) United States Patent
Zhu et al.

(10) Patent No.: US 11,973,020 B2
(45) Date of Patent: Apr. 30, 2024

(54) METAL-INSULATOR-METAL CAPACITOR WITH TOP CONTACT

(71) Applicant: QUALCOMM Incorporated, San Diego, CA (US)

(72) Inventors: John Jianhong Zhu, San Diego, CA (US); Lixin Ge, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 170 days.

(21) Appl. No.: 17/470,274

(22) Filed: Sep. 9, 2021

(65) Prior Publication Data

US 2023/0072667 A1    Mar. 9, 2023

(51) Int. Cl.
*H01L 23/522* (2006.01)
*H01L 21/768* (2006.01)
*H01L 49/02* (2006.01)

(52) U.S. Cl.
CPC .... *H01L 23/5223* (2013.01); *H01L 21/76838* (2013.01); *H01L 28/40* (2013.01)

(58) Field of Classification Search
CPC ........... H01L 21/76838; H01L 23/5223; H01L 28/40; H01L 28/86; H01L 28/87; H01L 28/88; H01L 28/91; H01L 28/92
See application file for complete search history.

(56) References Cited

U.S. PATENT DOCUMENTS

| | | |
|---|---|---|
| 9,397,038 B1 | 7/2016 | Uzoh et al. |
| 2010/0224960 A1 | 9/2010 | Fischer |
| 2018/0197946 A1 | 7/2018 | Leobandung |
| 2019/0165188 A1* | 5/2019 | Chang ............... H01L 21/0271 |
| 2019/0333983 A1* | 10/2019 | Rubin .................. H01L 28/40 |
| 2020/0176557 A1 | 6/2020 | Yin et al. |
| 2021/0098423 A1* | 4/2021 | Chen ............... H01L 21/76807 |
| 2021/0376058 A1* | 12/2021 | Shen .................... H01L 28/90 |
| 2022/0352052 A1* | 11/2022 | Ng ................... H01L 23/49816 |

OTHER PUBLICATIONS

International Search Report and Written Opinion—PCT/US2022/074289—ISA/EPO—dated Nov. 18, 2022.

* cited by examiner

*Primary Examiner* — Nelson Garces
(74) *Attorney, Agent, or Firm* — Muncy, Geissler, Olds & Lowe, P.C./Qualcomm Incorporated

(57) ABSTRACT

Disclosed are examples of a device and method of fabricating a device including a first top contact, a second top contact, adjacent the first top contact, a first mesa disposed below the first top contact and a second mesa disposed below the second top contact. A first plate of a metal-insulator-metal (MIM) capacitor is disposed below the first top contact and electrically coupled to the first top contact. A first insulator of the MIM capacitor is disposed on the first plate. A second plate of the MIM capacitor is disposed on the first insulator and electrically coupled to the second top contact. A second insulator of the MIM capacitor is disposed on the second plate. A third plate of the MIM capacitor is disposed on the second insulator and electrically coupled to the first top contact.

30 Claims, 12 Drawing Sheets

METAL-INSULATOR-METAL CAPACITOR WITH TOP CONTACT

FIELD OF DISCLOSURE

This disclosure relates generally to semiconductor devices including capacitors, and more specifically, but not exclusively, to metal-insulator-metal (MIM) capacitors and fabrication techniques thereof.

BACKGROUND

High performance computation (HPC) processors, such as those for artificial intelligence (AI), are large and use capacitors for power decoupling to improve power IR drop for high performance high frequency computations. Multiple plate MIM capacitors can be used to decouple the power supply lines (Vdd) to improve processor performance. The MIM capacitors also may have other uses. However, conventional MIM capacitors may provide insufficient decoupling performance for HPC processors and other high-performance systems.

Accordingly, there is a need for systems, apparatus, and methods that overcome the deficiencies of conventional capacitor configurations including the methods, systems and apparatuses provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes an apparatus including a first top contact; a second top contact, adjacent the first top contact; a first mesa disposed below the first top contact; and a second mesa disposed below the second top contact; a first plate of a metal-insulator-metal (MIM) capacitor disposed below the first top contact and electrically coupled to the first top contact; a first insulator of the MIM capacitor disposed on the first plate; a second plate of the MIM capacitor disposed on the first insulator and electrically coupled to the second top contact; a second insulator of the MIM capacitor disposed on the second plate; and a third plate of the MIM capacitor disposed on the second insulator and electrically coupled to the first top contact.

In accordance with the various aspects disclosed herein, at least one aspect includes a method of fabricating a device. The method may include: forming a first mesa; forming a second mesa adjacent the first mesa; depositing a first plate of a metal-insulator-metal (MIM) capacitor between the first mesa and the second mesa, wherein a portion of the first plate extends to the first mesa; depositing a first insulator of the MIM capacitor on the first plate, wherein a portion of the first insulator extends to the first mesa and the second mesa; depositing a second plate of the MIM capacitor on the first insulator between the first mesa and the second mesa, wherein a portion of the second plate extends to the second mesa; depositing a second insulator of the MIM capacitor on the second plate, wherein a portion of the second insulator extends to the first mesa and the second mesa; depositing a third plate of the MIM capacitor on the second insulator between the first mesa and the second mesa, wherein a portion of the third plate extends to the first mesa; forming a first top contact, wherein the first mesa is disposed below the first contact and the first plate and the second plate are electrically coupled to the first top contact; and forming a second top contact, wherein the second mesa is disposed below the second contact and the second plate is electrically coupled to the second contact.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
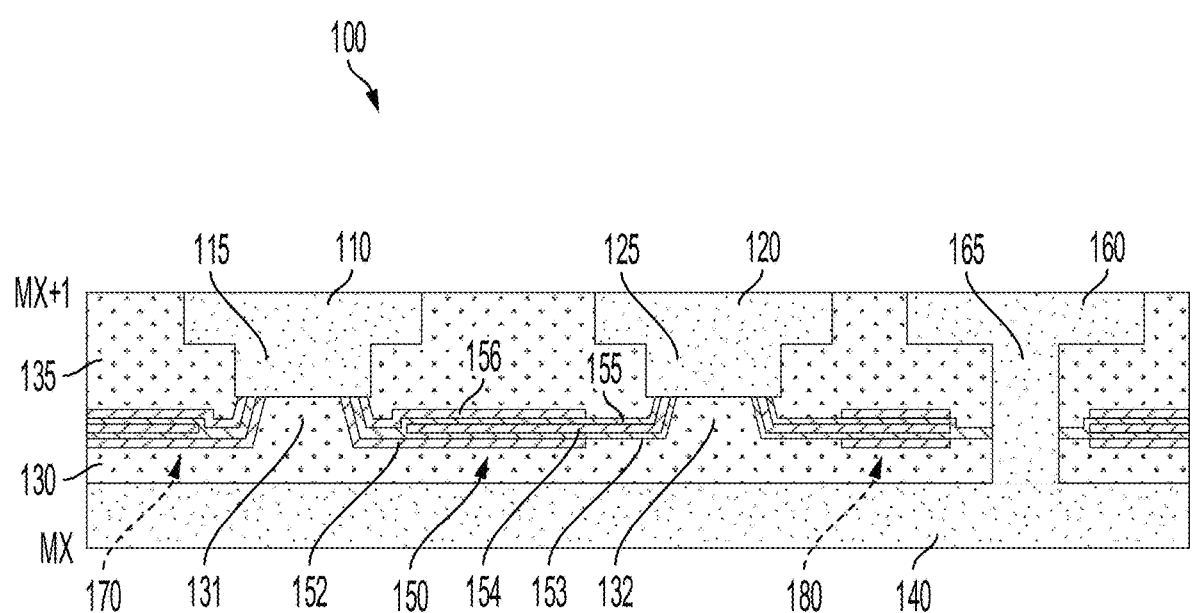
FIG. 1 illustrates a device including a MIM capacitor in accordance with one or more aspects of the disclosure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

Further, it should be noted that terms or phrases such as "lower", "upper", "left", "right", "below", "above", "horizontal, "vertical", "top", "bottom", "side", "sidewall", etc. are used for convenience. Unless otherwise specifically indicated, such terms/phrased are not intended to indicate absolute orientations or directions. Also as indicated, terms "on" and "in contact with" may be used synonymously unless otherwise specifically indicated.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As discussed in the background, in high performance computing integrated circuit (IC) design, a large size decoupling capacitor can be used for VDD decoupling to reduce IR drop, from the front side. Further, the top metal layer (TME) MIM capacitors have less power decoupling effectiveness and larger IR drop.

IC level power distribution network (PDN) IR drop from front side of BEOL presents additional problems for IC scaling of 5 nm technologies. PDN IR drop degrades performance improvement from the reduced scale technologies, as technology scaling continues to shrink area and improve performance. Current process integration techniques do not allow for improved PDN IR drop when technology scales. High density MIM caps with multi-plate (e.g., 3 to 4-plate) configurations are beneficial for decoupling, however, these configurations can present increased process challenges during the fabrication. Various aspects disclosed and discussed in further detail herein provide for MIM capacitors and fabrication processes to facilitate fabrication of multi-plate MIM capacitors with no limit in MIM metal plate number. Metal and via processes are compatible with conventional metal modules.

FIG. 1 illustrates a partial cross-sectional view of device 100 including a multiplate MIM capacitor 150 in accordance with one or more aspects of the disclosure. In some aspects, the device 100 may be a die, an integrated circuit, a package, and the like. Additionally, it will be appreciated that the device 100 may include multiple components in an integrated device, of which only a portion is illustrated. As illustrated, the device 100 may include a first inter-metal dielectric (IMD) layer 130 and a second IMD layer 135, which each may comprise one or more layers of dielectric material. The first IMD layer 130 is disposed on a first metal layer Mx. A second metal layer Mx+1 is at least partially embedded in the second IMD layer 135 along with one or more vias 165 or partial vias 115 and 125. The second IMD layer 135 may have top contacts formed in the Mx+1 metal layer, such as a first top contact 110 and a second top contact 120. The first top contact 110 may be coupled to a first partial via 115 to facilitate electrical connection to a first plate 152 of MIM capacitor 150 and a third plate 156 of MIM capacitor 150. The first partial via 115 may be disposed on a first mesa 131 formed in the first IMD layer 130. In some aspects the first mesa 131 may have tapered sides and be formed as a conical structure so that when viewed from a top view it will have a generally circular shape. In some aspects, the second top contact 120 may have a similar structure to the first top contact 110. The second top contact 120 may be coupled to a second partial via 125 to facilitate electrical connection to a second plate 154 of the MIM capacitor 150. The second partial via 125 may be disposed on a second mesa 132 formed in the first IMD layer 130. In some aspects the second mesa 132 may have tapered sides and formed as a conical structure so that when viewed from a top view it will have a generally circular shape. It will be appreciated the various aspects disclosed are not limited to this example configuration and can include other geometric shapes. For example, the first mesa 131 and/or the second mesa 132 may having a trapezoidal, rectangular, square, oval, etc. shaped top view of a corresponding structure forming the first mesa 131 and/or the second mesa.

The multiplate MIM capacitor 150 is illustrated in a 3-plate configuration and includes the second plate 154, which is separated from the first plate 152 by a first insulator 153 of the MIM capacitor 150. The second plate 154 is separated from the third plate 156 by a second insulator 155. As discussed in the foregoing, first plate 152 and third plate 156 are coupled to the first top contact 110 and the second plate 154 is coupled to the second top contact 120, which allows for both connections to MIM capacitor 150 to be located on the same side. Additionally, in some aspects the first plate 152, the first insulator 153 the second plate 154, the second insulator 155 and third plate 156 may extend beyond the top contacts 110 and 220 and even beyond the via 165. Other configurations are discussed herein. Accordingly, the various aspects disclosed are not limited to the illustrated example configurations.

The second IMD layer 135 may have additional structures formed from the Mx+1 metal layer, such as metal trace 160 which may be coupled to metal trace 140 formed in metal layer Mx using via 165. The metal traces 140 and 160 and via 165 may be coupled to a positive potential, a ground potential, a digital signal, an analog signal, or any other suitable signal for routing in the device 100.

Further, in some aspects, additional separate MIM capacitors be formed. For example, MIM capacitor 170 may be coupled to the first top contact 110. Likewise, MIM capacitor 180 may be coupled to the second top contact 120. In the configuration with MIM capacitor 180 there will be a physical plate separation (by plate patterning) in the region below 125 or 115 (not illustrated in FIG. 1, but see, e.g., example configurations illustrated in part in FIG. 5 and FIG. 6). In this optional aspect, it will be appreciated that another top contact (not illustrated) may be adjacent to top contact 110 and coupled to the center plate of MIM capacitor 170. Likewise, still another top contact (not illustrated) may be adjacent the second top contact (but not visible in the cross-sectional view) and coupled to the top and bottom plates of MIM capacitor 180. In further aspects, one or both of the other contacts may be located in the Mx metal layer or other metal layer different from Mx+1. Accordingly, it is possible to have a portion of the MIM capacitors having top contacts on a same metal layer and others having contacts on different metal layers.

It will be appreciated that the various plates (e.g., 152, 154, and 156) and other metal layers and structures (e.g., 110, 115, 120, 125, 140, 160 and 165) may be any high conductive material, such as, copper (Cu), aluminum (AL), silver (Ag), gold (Au), titanium (Ti), nickel (Ni), tungsten (W), ruthenium (Ru), cobalt (Co), alloys or combinations thereof. It will be appreciated that in some aspects, the Mx and Mx+1 metals may be different. The insulators (e.g., 153 and 155) may be a high dielectric constant (high-k) material, such as hafnium oxide (HfOx) or similar materials. The first IMD layer 130 and the second IMD layer 135, each may be a low dielectric constant (low-k) material, such as doped silicon dioxide (SiO2), or its fluorine-doped, carbon-doped, and carbon-doped forms, as well as spin-on organic polymeric dielectrics such as polyimide (PI), benzocyclobutene (BCB), polytetrafluoroethylene (PTFE) and/or silicone based polymeric dielectrics. It will be appreciated that the illustrated configuration and example materials are provided merely to aid in explanation of the various aspects and should not be construed to limit the various aspects disclosed. For example, although a 3-plate configuration is illustrated, the various aspects of the disclosure allow for four or more plates in the MIM capacitors.

In some aspects of the disclosure, the first top contact 110 may be coupled to a first power connection, which may be coupled to a power supply (not illustrated). The second top contact 120 may be coupled to a second power connection, which may also be coupled to the power supply. In some aspects, the power supply may be located remote from the first power connection and the second power connection. In some aspects, the power supply may be local to or even in direct contact with the first power connection and the second power connection. In some aspects, the first power connection may be configured to be at a positive potential (e.g., Vdd). The second power connection may be configured to be at a negative potential (e.g., Vss) or ground. In other aspects, these may be reversed, so the first power connection is configured to be at Vss, or ground and the second power connection is configured to be at Vdd. The first power connection and the second power connection may be formed, at least in part, from portions of the metal layer Mx+1 or may be coupled to the top contacts using vias coupling the top contacts to other metal layers. It will be appreciated that having the MIM capacitors in close proximity to a power input provide for improved decoupling and performance of the power distribution network. It will be appreciated that various aspects disclosed herein are not limited to decoupling capacitor applications and may be used in any conventional capacitor application.

Figure 2:
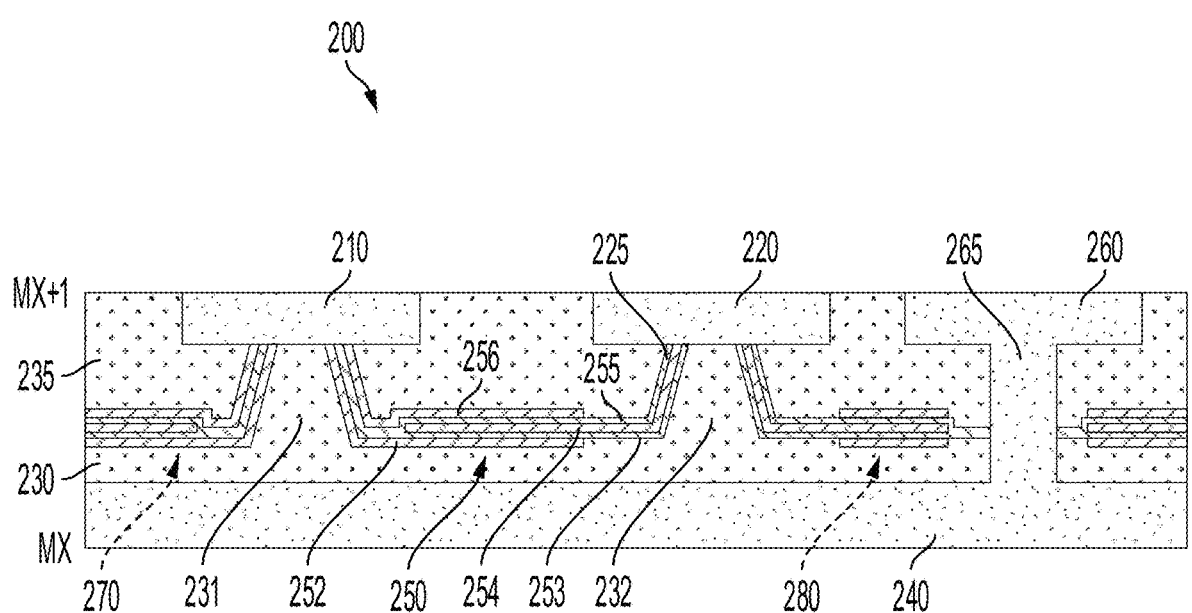
FIG. 2 illustrates a device including a MIM capacitor in accordance with one or more aspects of the disclosure.

FIG. 2 illustrates a partial cross-sectional view of device 200 including a multiplate MIM capacitor 250 in accordance with one or more aspects of the disclosure. In some aspects, the device 200 may be a die, an integrated circuit, a package, and the like. Additionally, it will be appreciated that the device 200 may include multiple components in an integrated device, of which only a portion is illustrated. As illustrated, the device 200 may include a first inter-metal dielectric (IMD) layer 230, and a second IMD layer 235, each of which may comprise one or more layers of dielectric material. The first IMD layer 230 is disposed on a first metal layer Mx. A second metal layer Mx+1 is at least partially embedded in the second IMD layer 235 along with one or more vias 265. The second IMD layer 235 may have MIM capacitor top contacts formed in the Mx+1 metal layer, such as a first top contact 210 and a second top contact 220. The first top contact 210 may be coupled directly to a first plate 252 of MIM capacitor 250 and a third plate 256 of MIM capacitor 250. The top contact 210 may be disposed on a first mesa 231 formed in the second IMD layer 235. In some aspects the first mesa 231 may have tapered sides and be formed as a conical structure so that when viewed from a top view it will have a generally circular shape. In some aspects, the second top contact 220 may have a similar structure to the first top contact 210. The second top contact 220 may be coupled to a second plate 254 of the MIM capacitor 250. The second top contact 220 may be disposed on a second mesa 232 formed in the second IMD layer 235. In some aspects the second mesa 232 may have tapered sides and formed as a conical structure so that when viewed from a top view it will have a generally circular shape.

The multiplate MIM capacitor 250 is illustrated in a 3-plate configuration and includes the second plate 254, which is separated from the first plate 252 by a first insulator 253 of the MIM capacitor 250. The second plate 254 is separated from the third plate 256 by a second insulator 255. As discussed in the foregoing, first plate 252 and third plate 256 are coupled to the first top contact 210 and the second plate 254 is coupled to the second top contact 220, which allows for both connections to MIM capacitor 250 to be located on the same side. Additionally, in some aspects the first plate 252, the first insulator 253 the second plate 254, the second insulator 255 and third plate 256 may extend beyond the top contacts 210 and 220 and even beyond the via 265. Other configurations are discussed herein. Accordingly, the various aspects disclosed are not limited to the illustrated example configurations.

The second IMD layer 235 may have additional structures formed from the Mx+1 metal layer, such as metal trace 260 which may be coupled to metal trace 240 formed in metal layer Mx using via 265. The metal traces 240 and 260 and via 265 may be coupled to a positive potential, a ground potential, a digital signal, an analog signal, or any other suitable signal for routing in the device 200.

Further, in some aspects, additional separate MIM capacitors be formed. For example, optional MIM capacitor 270 may be coupled to the first top contact 210. Likewise, optional MIM capacitor 280 may be coupled to the second top contact 120. An example configuration is illustrated in part in FIG. 5. It will be appreciated that another top contact (not illustrated) may be adjacent to top contact 210 and coupled to the center plate of MIM capacitor 270. Likewise, still another top contact (not illustrated) may be adjacent the second top contact 220 (but not visible in the cross-sectional view) and coupled to the top and bottom plates of MIM capacitor 280. In further aspects, one or both of the other contacts may be located in the Mx metal layer or other metal layer different from Mx+1. Accordingly, it is possible to have a portion of the MIM capacitors having top contacts on a same metal layer and others having contacts on different metal layers.

It will be appreciated that the various plates (e.g., 252, 254, and 256) and other metal layers and structures (e.g., 210, 215, 220, 225, 240, 260 and 265) may be any high conductive material, such as, copper (Cu), aluminum (AL), silver (Ag), gold (Au), titanium (Ti), nickel (Ni), alloys or combinations thereof. The insulators (e.g., 253 and 255) may be a high dielectric constant (high-k) material. The first IMD layer 230 and second IMD layer 235 may each be a low dielectric constant (low-k) material, such as doped silicon dioxide (SiO2), or its fluorine-doped, carbon-doped, and carbon-doped forms, as well as spin-on organic polymeric dielectrics such as polyimide (PI), benzocyclobutene (BCB), polytetrafluoroethylene (PTFE) and/or silicone based polymeric dielectrics. It will be appreciated that the illustrated configuration and example materials are provided merely to aid in explanation of the various aspects and should not be construed to limit the various aspects disclosed. For example, although a 3-plate configuration is illustrated, the various aspects of the disclosure allow for four or more plates in the MIM capacitors.

In accordance with the various aspects disclosed herein, at least one aspect includes an apparatus including a multiplate MIM capacitor (e.g., 150, 250). The apparatus includes a first top contact (110, 210); a second top contact (120, 220), adjacent the first top contact; a first plate (152, 252) of a metal-insulator-metal (MIM) capacitor (150, 250) disposed below the first top contact and electrically coupled to the first top contact; a first insulator (153, 253) of the MIM capacitor (150, 250) disposed on the first plate (152, 252); a second plate (154, 254) of the MIM capacitor disposed on the first insulator (153, 253) and electrically coupled to the second top contact (120, 220); a second insulator (155, 255) of the MIM capacitor disposed on the second plate (154, 254); and a third plate (156, 256) of the MIM capacitor (150, 250) disposed on the second insulator and electrically coupled to the first top contact (110, 210). It will be appreciated that the various aspects disclosed provide various technical advantages. For example, in at least some aspects, having both MIM contacts being adjacent and a same side, allow for improved manufacturing and is compatible with standard metal and via processes. Other technical advantages will be recognized from various aspects disclosed herein and these technical advantages are merely provided as examples and should not be construed to limit any of the various aspects disclosed herein.

Other embodiments of this aspect include one or more of the following features. The apparatus may include: a first mesa (131, 231) disposed below the first top contact; and a second mesa (132, 232) disposed below the second top contact. In some aspects, a first partial via (115) disposed between the first top contact (110) and the first mesa, where the first plate and third plate may be electrically coupled to the first top contact (110) through the first partial via (115); and a second partial via (125) disposed between the second top contact (120) and the second mesa (132), where the second plate (154) is electrically coupled to the second top contact (120) through the second partial via. In other aspects, the first top contact (210) is directly disposed on the first mesa (231) and the second top contact (220) is directly disposed on the second mesa (232). The first top contact (110, 220) and the second top contact (120, 220) are at least partially disposed in the second IMD layer (135, 235). The first top contact (110, 210) and the second top contact (120, 220) are in a same metal layer (Mx+1) in the second IMD layer (135, 235). The first IMD layer (130, 230) is disposed on the lower metal layer (Mx). Additional aspects will be appreciated from the various aspects disclosed herein.

In order to fully illustrate aspects of the design of the present disclosure, methods of fabrication are presented. Other methods of fabrication are possible and discussed fabrication methods are presented only to aid understanding of the concepts disclosed herein.

FIGS. 3A-3K illustrate example portions of fabricating a device 300, such as the devices illustrated in FIGS. 1 and 2, in accordance with one or more aspects of the disclosure. FIGS. 3A-3K generally illustrate cross-sectional views of the various stages of fabrication.

Figure 3A:
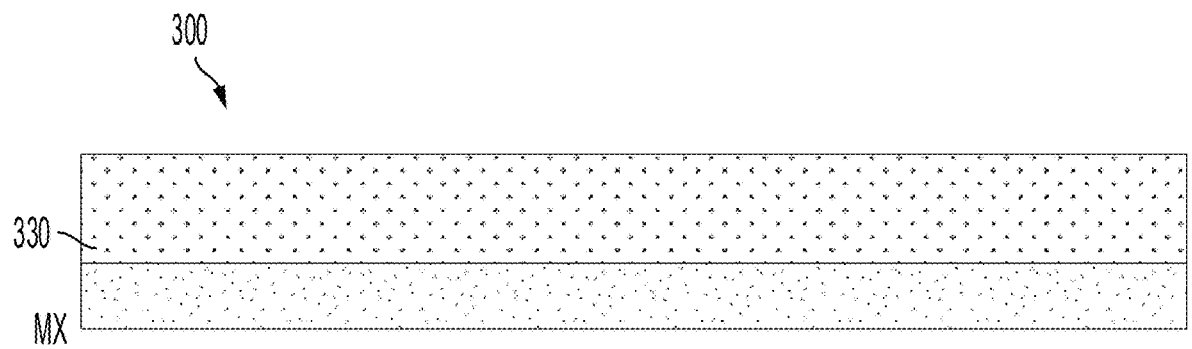
FIGS. 3A-K illustrate portions of a process for fabricating a device including a MIM capacitor in accordance with one or more aspects of the disclosure.

FIG. 3A illustrates a portion of a fabrication process of the device 300 in accordance with one or more aspects of the disclosure. As shown in FIG. 3A, the process can begin with an inter-metal dielectric (IMD) layer 330 being deposited on a metal layer Mx.

Figure 3B:
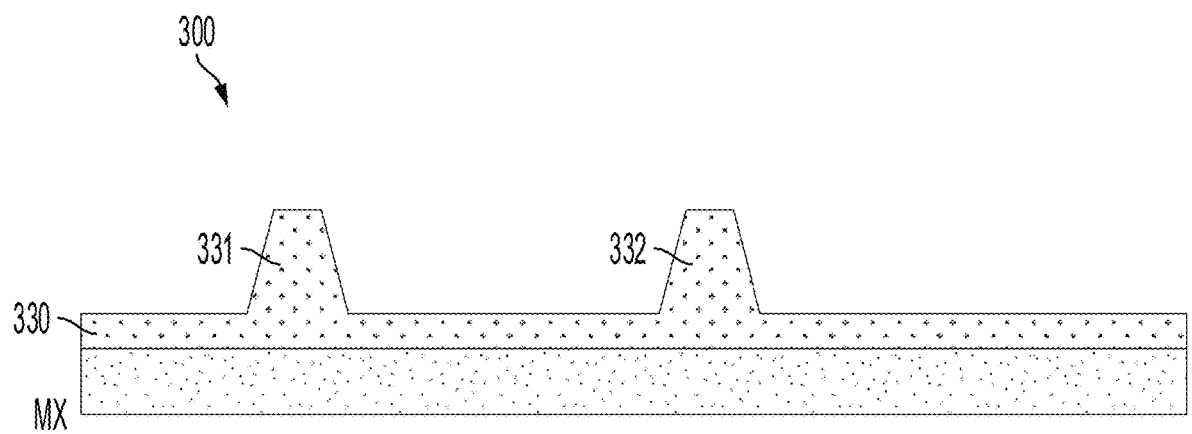

FIG. 3B illustrates a portion of a fabrication process of the device 300 in accordance with one or more aspects of the disclosure. As shown in FIG. 3B, the process can continue with the IMD layer 330 deposited on the metal layer Mx. In this portion, the IMD layer 330 is patterned and etched to form a first mesa 331 and a second mesa 332. In some aspects, the IMD layer 330 may be formed by depositing one layer that will have a thickness greater than or equal to the height of the first mesa 331 and the second mesa 332. In alternative aspects, IMD layer 330 may be formed by depositing more than one layer, which may then be patterned and etched to form the first mesa 331 and the second mesa 332.

Figure 3C:
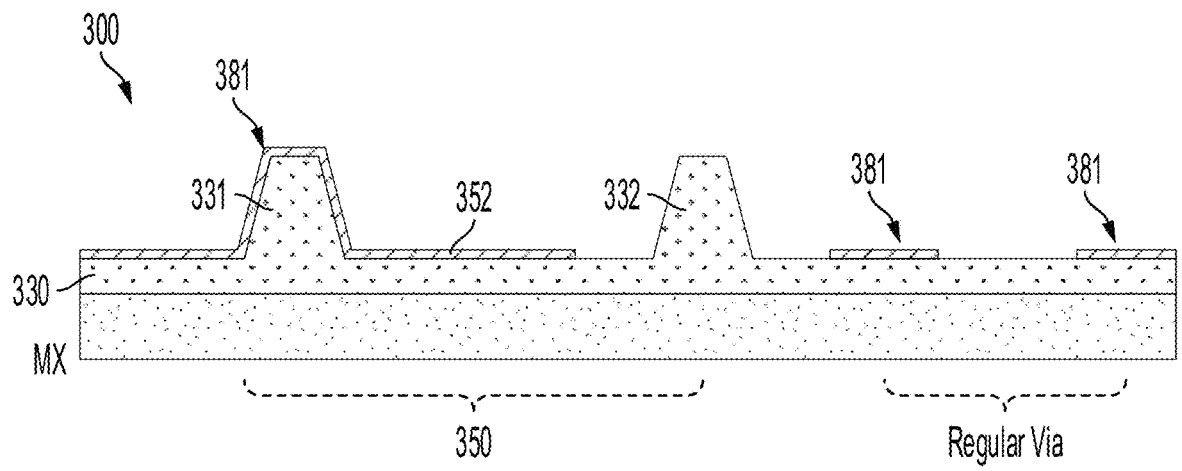

FIG. 3C illustrates a portion of a fabrication process of the device 300 in accordance with one or more aspects of the disclosure. As shown in FIG. 3B, the process can continue with the IMD layer 330 deposited on the metal layer Mx and with the first mesa 331 and the second mesa 332 formed. In this portion, a first metal 381 for the MIM capacitor 350 (not fully formed) is deposited over the IMD 330 including the first mesa 331 and the second mesa 332. The first metal 381 is patterned and etched and part is used to form the first plate 352, which is still connected to other portions of first metal 381. In some aspects, the first plate 352 and the MIM capacitor 350 may extend beyond the MIM capacitor 350 node region (e.g., to the opposite side of the first mesa 331). Further, as illustrated the metal first metal 381 extends over the first mesa 331, while it has been removed from the second mesa 332. In some aspects, where there are additional MIM capacitors, it will be appreciated that other plates for other MIM capacitors can be formed at this time from first metal 381. Further, in some aspects the first metal 381 may be patterned to form other metal structures. Likewise, it will be appreciated that the fabrication process can proceed simultaneously for the MIM capacitor 350 node region (e.g., region where top contacts for MIM capacitor 350 are formed) and the regular via region.

Figure 3D:
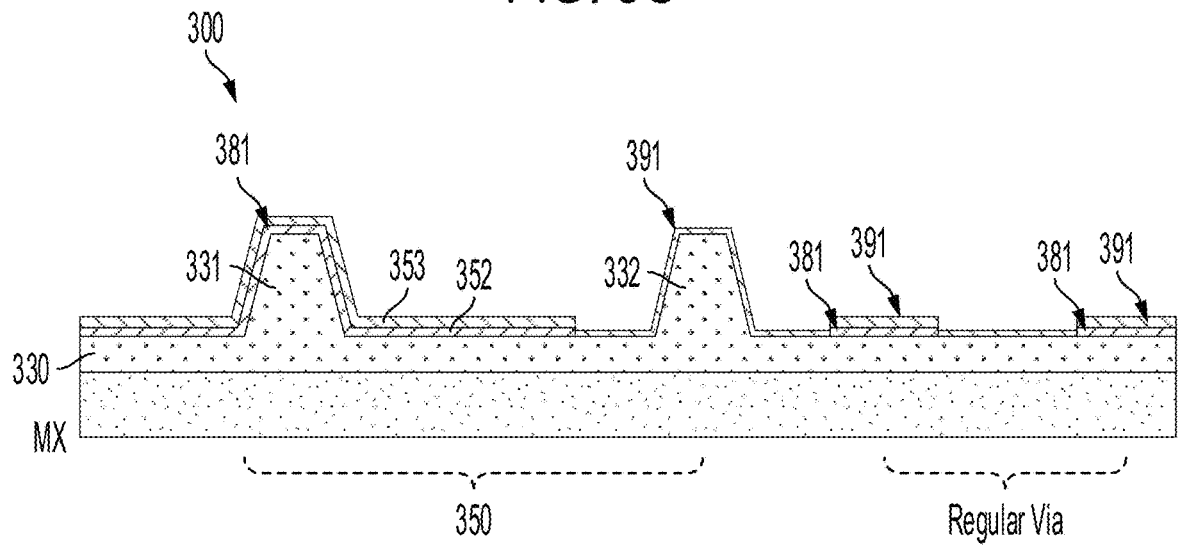

FIG. 3D illustrates a portion of a fabrication process of the device 300 in accordance with one or more aspects of the disclosure. As shown in FIG. 3D, the process can continue with the IMD layer 330 deposited on the metal layer Mx and with the first mesa 331 and the second mesa 332 formed and the first metal 381 deposited. In this portion, a first insulator layer 391 (e.g., high-k dielectric) for the MIM capacitor 350 is deposited over the first metal 381 and the IMD 330 including the first mesa 331 and the second mesa 332. In some aspects, the first insulator 353 is formed from a portion of the first insulator layer 391. It will be appreciated that in some aspects the various insulator (dielectric) layers (e.g., 391) and metal layers (e.g., 381) are formed by conformal deposition. Accordingly, the surface profile of the subsequent layer will generally follow the previous layer surface profile. For ease of illustration, the various surface profiles have been illustrated as simple geometric shapes. However, these illustrations should not be construed to be limiting of the various aspects disclosed herein. Further, it will be appreciated that the illustrated aspects represent only a portion of the structure.

Figure 3E:
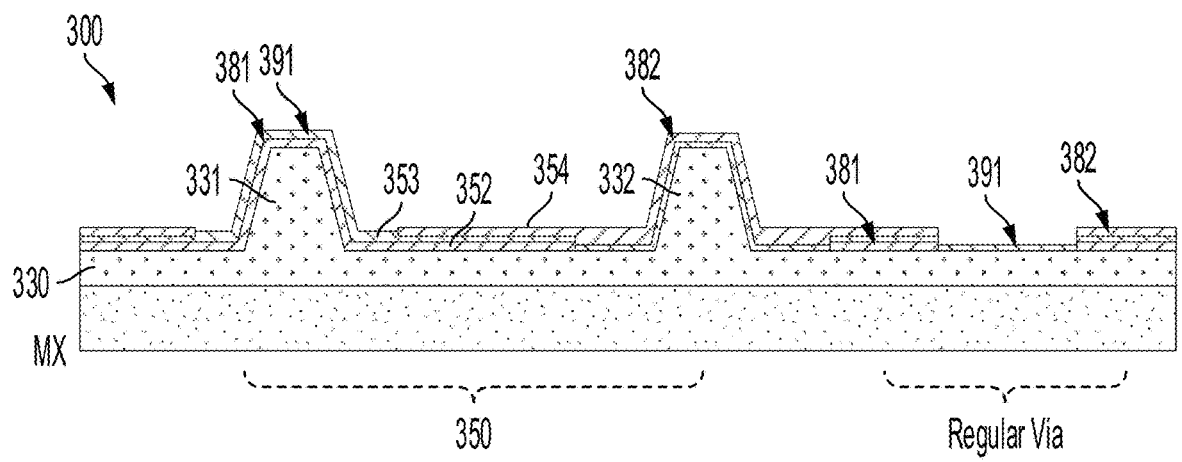

FIG. 3E illustrates a portion of a fabrication process of the device 300 in accordance with one or more aspects of the disclosure. As shown in FIG. 3E, the process can continue with the IMD layer 330 deposited on the metal layer Mx and with the first mesa 331 and the second mesa 332 formed. Additionally, the first metal 381 and the first insulator layer 391 are deposited. In this portion, a second metal 382 for the MIM capacitor 350 (not fully formed) is deposited over the first insulator layer 391 including over the first mesa 331 and the second mesa 332. The second metal 382 is patterned and etched and part is used to form the second plate 354, which is still connected to other portions of second metal 382. Further, as illustrated the second metal 382 extends over the second mesa 332, while it has been removed from the first mesa 331. In some aspects, where there are additional MIM capacitors, it will be appreciated that other plates for other MIM capacitors can be formed at this time from second metal 382.

Figure 3F:
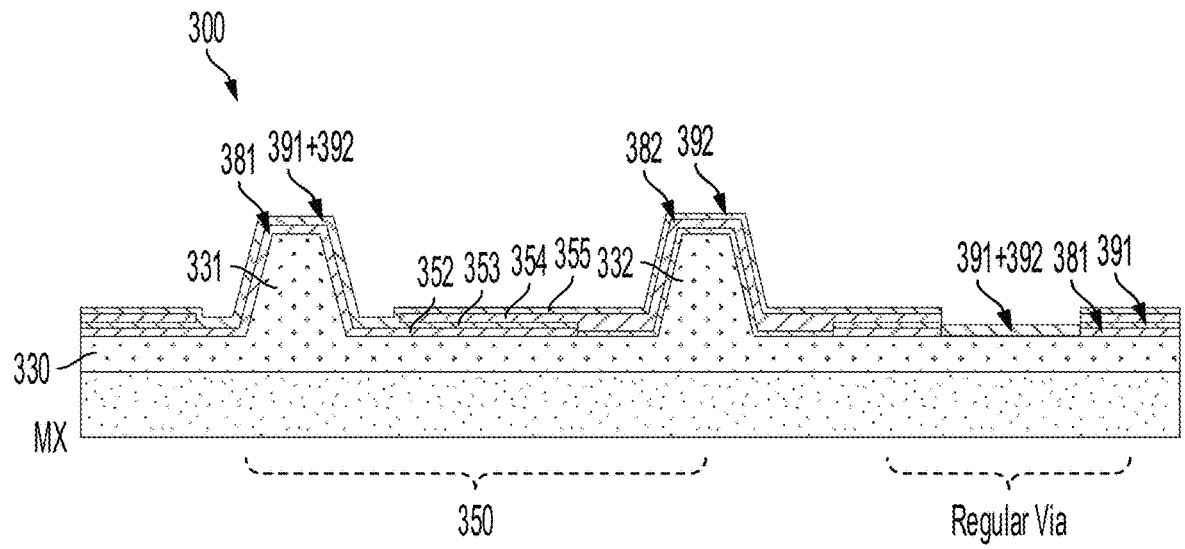

FIG. 3F illustrates a portion of a fabrication process of the device 300 in accordance with one or more aspects of the disclosure. As shown in FIG. 3D, the process can continue with the IMD layer 330 deposited on the metal layer Mx and with the first mesa 331 and the second mesa 332 formed. Additionally, the first metal 381, the first insulator layer 391, and the second metal 382 are deposited. In this portion, a second insulator layer 392 (e.g., high-k dielectric) for the MIM capacitor 350 is deposited over the second metal 382 and exposed portions of the first insulator layer 391, which are deposited over the IMD layer 330 including the first mesa 331 and the second mesa 332. In some aspects, second insulator 355 is formed from a portion of the second insulator layer 392. In other aspects, the second insulator layer 392 forms the second insulator and/or other insulator structures that may extend beyond the MIM capacitor 350 node region. Further, it will be appreciated that sections of the illustration where the first insulator layer 391 and the second insulator 392 overlap may be referred to as 391+392, as these portions may be represented as common insulator element for convenience of illustration.

Figure 3G:
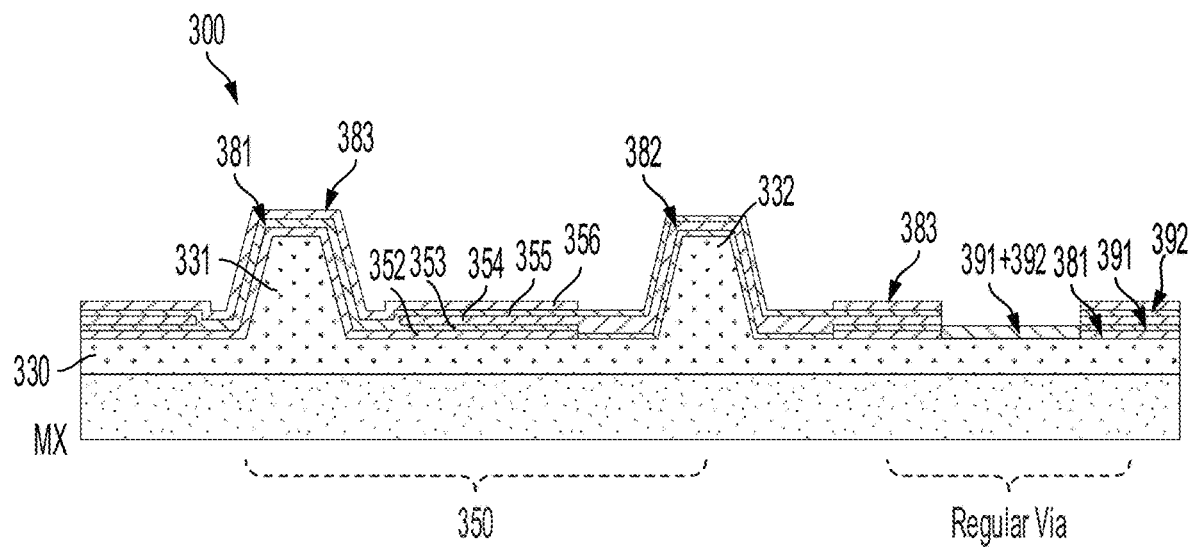

FIG. 3G illustrates a portion of a fabrication process of the device 300 in accordance with one or more aspects of the disclosure. As shown in FIG. 3G, the process can continue with the IMD layer 330 deposited on the metal layer Mx and with the first mesa 331 and the second mesa 332 formed. Additionally, the first metal 381, the first insulator layer 391, the second metal 382, and the second insulator layer 392 are deposited. In the illustrated aspect, where the first insulator layer 391 and the second insulator layer 392 overlap, these sections may be referred to as 391+392. In this portion of the process, a third metal 383 for the MIM capacitor 350 is deposited over the second insulator layer 392 including over the first mesa 331 and the second mesa 332. The third metal 383 is patterned and etched and part is used to form the second plate 355, which is still connected to other portions of third metal 383. Further, as illustrated the third metal 383 extends over the first mesa 331, while it has been removed from the second mesa 332. In some aspects, where there are additional MIM capacitors, it will be appreciated that other plates for other MIM capacitors can be formed at this time from third metal 383.

Figure 3H:
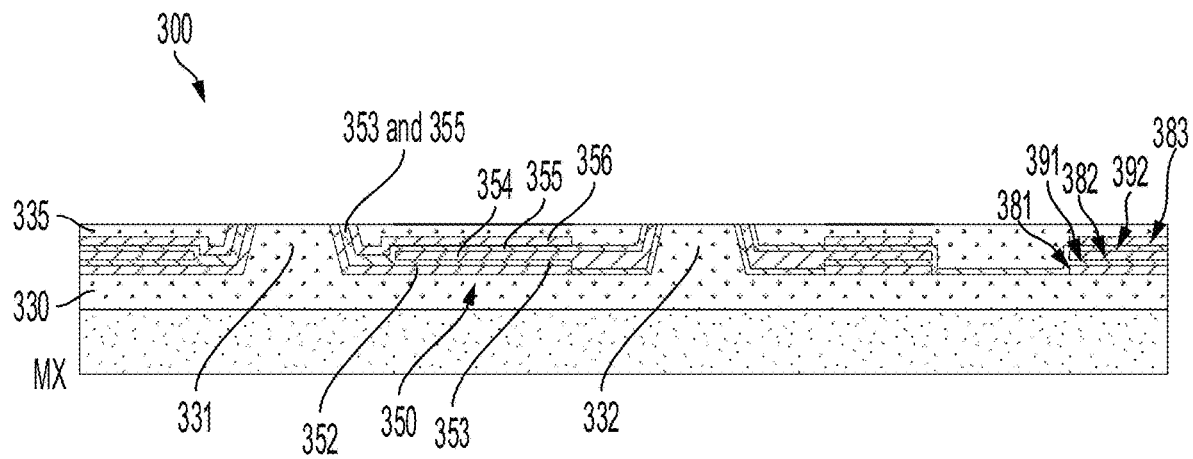

FIG. 3H illustrates a portion of a fabrication process of the device 300 in accordance with one or more aspects of the disclosure. As shown in FIG. 3H, the process can continue with the IMD layer 330 deposited on the metal layer Mx and with the first mesa 331 and the second mesa 332 formed. Additionally, the first metal 381, the first insulator layer 391, the second metal 382, the second insulator layer 392, and the third metal 383 are deposited. In this portion, a second IMD layer 335 is deposited over the third metal 383 and exposed portions of the second insulator layer 392. A chemical mechanical polish (CMP) is performed to remove excess material and planarize the top surface of the first mesa and the second mesa along with other portions of the device 300. As illustrated, extensions of the first plate 352 and the third plate 356 are exposed adjacent the top of the first mesa 331, along with the combined first insulator 353 and second insulator 355. The first plate 352 and the third plate 356 are separated by the first insulator 353 and the second insulator 355 at the first mesa 331. Further, an extension of the second plate 354 is exposed adjacent the top of the second mesa 332. The extension of the second plate 354 is disposed between the first insulator 353 and the second insulator 355 at the second mesa 332.

Figure 3I:
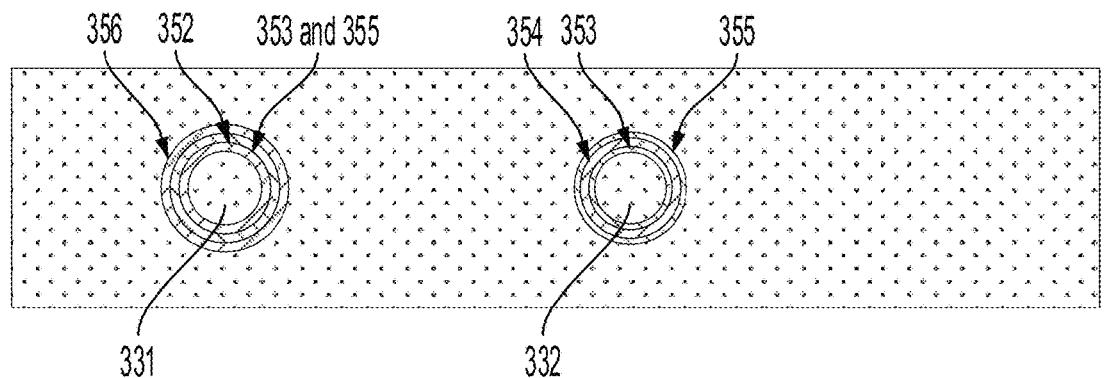

FIG. 3I illustrates a top view of a portion of the device 300, at the portion of the fabrication process illustrated in FIG. 3H, in accordance with one or more aspects of the disclosure. As shown in FIG. 3I, the first plate 352 and the third plate 356 are exposed on a side wall adjacent the top of the first mesa 331. The first plate 352 and the third plate 356 are separated by the first insulator 353 and the second insulator 355 at the exposed top of the first mesa 331. The second plate 354 is exposed on the sidewalls adjacent the exposed top of the second mesa 332. The second plate 354 is disposed between the first insulator 353 and the second insulator 355 adjacent exposed on the sidewalls adjacent the exposed top of the second mesa 332. In some aspects, the top cross-section of the first mesa 331 and the second mesa 332 may have a generally circular shape, however, it will be appreciated that the cross-sections of the first mesa 331 and the second mesa 332 are not limited to the circular shape and any geometric configuration can be used for the first mesa 331 and/or the second mesa 332. For example, the mesas could have an oval, a square, or rectangular cross-section when viewed from the top.

Figure 3J:
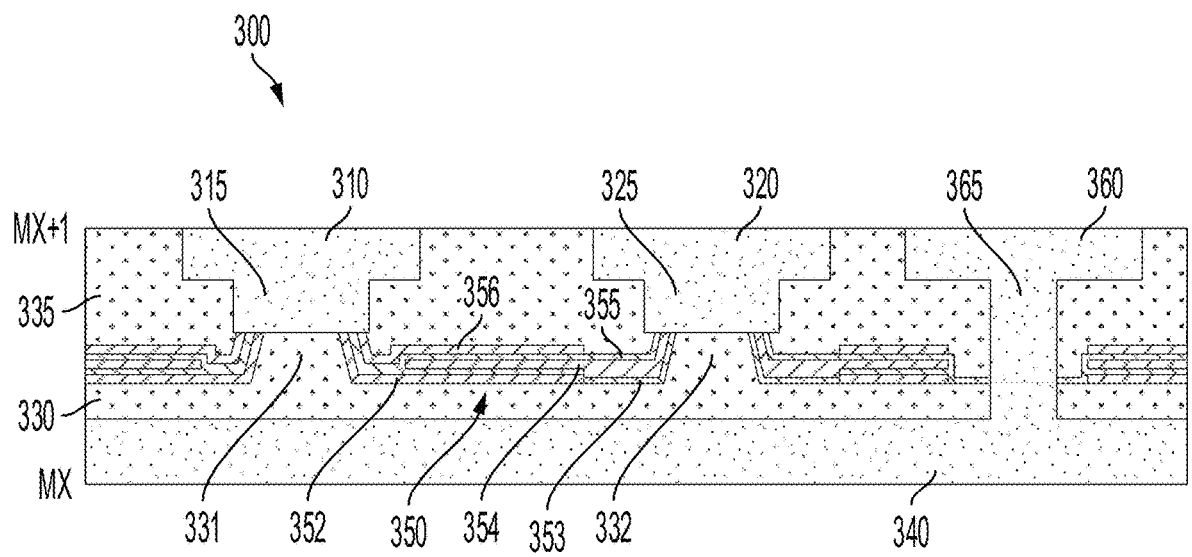

FIG. 3J illustrates a portion of a fabrication process of the device 300 in accordance with one or more aspects of the disclosure. As shown in FIG. 3J, the process can continue from FIG. 3H. In some aspects, the device 300 may be a die, an integrated circuit, a package, and the like. Additionally, it will be appreciated that the device 300 may include multiple components in an integrated device, of which only a portion is illustrated. As illustrated, the device 300 may include first IMD layer 330, which may comprise one or more layers of dielectric material. The first IMD layer 330 is disposed on a first metal layer Mx. In this portion of the process, partial via 315 is deposited on the first mesa 331, which allows for the partial via 315 to make electrical contact to the first plate 352 and the third plate 356. The partial via 325 is deposited on the second mesa 332, which allows for the partial via 325 to make electrical contact to the second plate 354. Further, via 365 is formed to make electrical contact with metal trace 340, which is in the Mx metal layer. Additionally, a second metal layer Mx+1 is deposited over the partial vias 315 and 325, via 365 and exposed portions of the second IMD 335. The second metal layer Mx+1 is patterned and etched to form a first top contact 310, a second top contact 320, and a metal trace 360. The first top contact 310 is electrically coupled to the first plate 352 and the third plate 356 through partial via 315. The second top contact 320 is electrically coupled to the second plate 354 through partial via 325. One or more additional layers may be added to the second IMD layer 335, which allows the first top contact 310, the second top contact 320 and metal trace 360 to be at least partially embedded in the second IMD layer 335 along with via 365 and partial vias 315 and 325.

Accordingly, it will be appreciated the device 300 is similar to the device 100, discussed above. The second IMD layer 335 has top contacts formed in the Mx+1 metal layer, such as the first top contact 310 and the second top contact 320. The first top contact 310 may be coupled to a first partial via 315 to facilitate electrical connection to the first plate 352 of MIM capacitor 350 and the third plate 356 of MIM capacitor 350. The first partial via 315 may be disposed on the first mesa 331 formed in the first IMD layer 330. In some aspects the first mesa 331 may have tapered sides and be formed as a conical structure so that when viewed from a top view it will have a generally circular shape. In some aspects, the second top contact 320 may have a similar structure to the first top contact 310. The second top contact 320 may be coupled to a second partial via 325 to facilitate electrical connection to a second plate 354 of the MIM capacitor 350. The second partial via 325 may be disposed on a second mesa 332 formed in the first IMD layer 330. In some aspects the second mesa 332 may have tapered sides and formed as a conical structure so that when viewed from a top view it will have a generally circular shape.

The multiplate MIM capacitor 350 is illustrated in a 3-plate configuration and includes the second plate 354, which is separated from the first plate 352 by the first insulator layer 353 of the MIM capacitor 350. The second plate 354 is separated from the third plate 356 by the second insulator 355. As discussed in the foregoing, first plate 352 and third plate 356 are coupled to the first top contact 310 and the second plate 354 is coupled to the second top contact 320, which allows for both connections to MIM capacitor 350 to be located on the same side.

The IMD layer 330 may have additional structures formed from the Mx+1 metal layer, such as metal trace 360 which may be coupled to metal trace 340 formed in metal layer Mx by via 365. The metal traces 340 and 360 and via 365 may be coupled to a positive potential, a ground potential, a digital signal, an analog signal, or any other suitable signal for routing in the device 300.

Figure 3K:
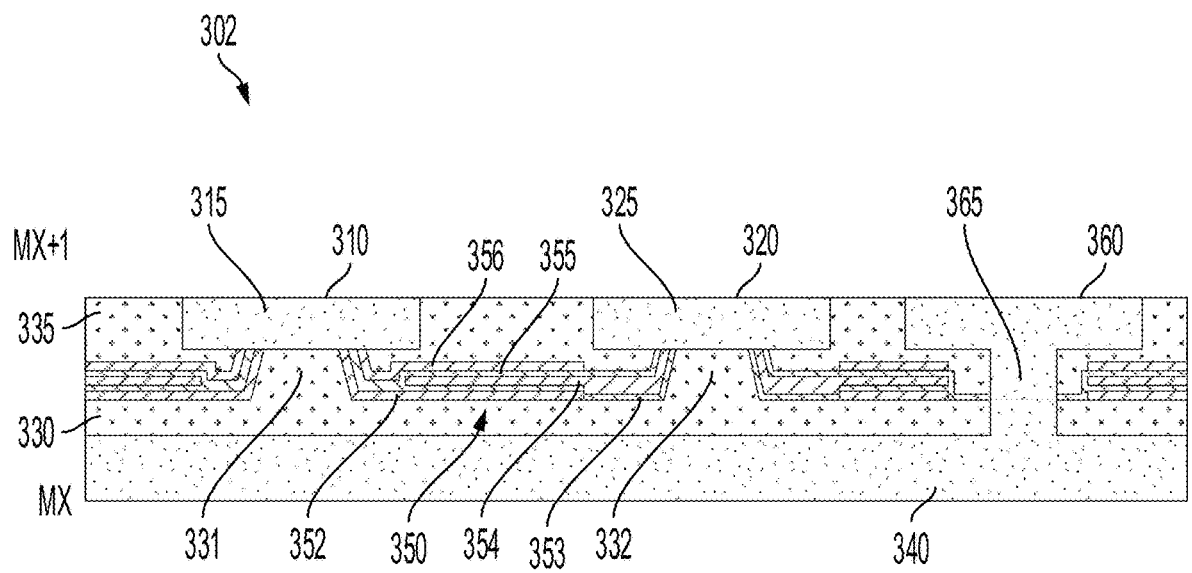

FIG. 3K illustrates a portion of a fabrication process of the device 302 in accordance with one or more aspects of the disclosure. As shown in FIG. 3K, the process can continue from FIG. 3H. In some aspects, the device 302 may be a die, an integrated circuit, a package, and the like. Additionally, it will be appreciated that the device 302 may include multiple components in an integrated device, of which only a portion is illustrated. As illustrated, the device 302 may include first IMD layer 330, which may comprise one or more layers of dielectric material. The first IMD layer 330 is disposed on a first metal layer Mx. In this portion of the process, via 365 is formed to make electrical contact with metal trace 340, which is in the Mx metal layer. Additionally, a second metal layer Mx+1 is deposited over the first mesa 331, the second mesa 332, via 365 and portions of the second IMD 335. The second metal layer Mx+1 is patterned and etched to form a first top contact 310, a second top contact 320, and a metal trace 360. The first top contact 310 is electrically coupled to the first plate 352 and the third plate 356 through direct contact. The second top contact 320 is electrically coupled to the second plate 354 through direct contact. One or more additional layers may be added to the second IMD layer 335, which allows the first top contact 310, the second top contact 320, and metal trace 360 to be at least partially embedded in the second IMD layer 335 along with via 365.

Accordingly, it will be appreciated the device 302 is similar to the device 200, discussed above. The second IMD layer 335 has top contacts formed in the Mx+1 metal layer, such as the first top contact 310 and the second top contact 320. The first top contact 310 may be directly electrically coupled to the first plate 352 of MIM capacitor 350 and the third plate 356 of MIM capacitor 350. In some aspects the first mesa 331 may have tapered sides and be formed as a conical structure so that when viewed from a top view it will have a generally circular shape. In some aspects, the second top contact 320 may have a similar structure to the first top contact 310. The second top contact 320 may be directly electrically coupled to the second plate 354 of the MIM capacitor 350. In some aspects the second mesa 332 may have tapered sides and formed as a conical structure so that when viewed from a top view it will have a generally circular shape.

The multiplate MIM capacitor 350 is illustrated in a 3-plate configuration and includes the second plate 354, which is separated from the first plate 352 by a first insulator layer 353 of the MIM capacitor 350. The second plate 354 is separated from the third plate 356 by the second insulator 355. As discussed in the foregoing, first plate 352 and third plate 356 are coupled to the first top contact 310 and the second plate 354 is coupled to the second top contact 320, which allows for both connections to MIM capacitor 350 to be located on the same side.

The IMD layer 330 may have additional structures formed from the Mx+1 metal layer, such as metal trace 360 which may be coupled to metal trace 340 formed in metal layer Mx by via 365. The metal traces 340 and 360 and via 365 may be coupled to a positive potential, a ground potential, a digital signal, an analog signal, or any other suitable signal for routing in the device 302.

Figure 4:
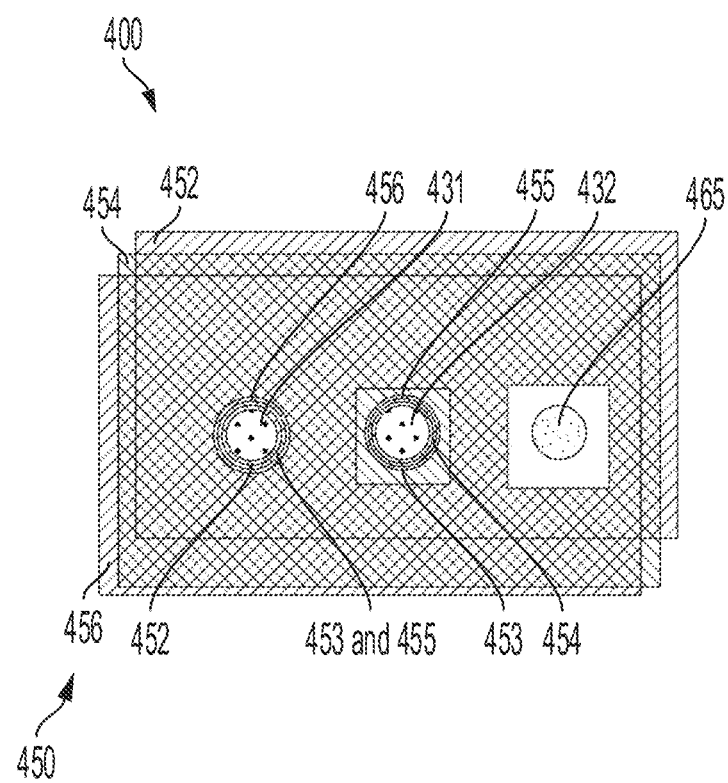
FIG. 4 illustrates a top view of a device including a MIM capacitor in accordance with one or more aspects of the disclosure.

FIG. 4 illustrates a portion of a device 400 in accordance with one or more aspects of the disclosure. In some aspects, the device 400 may be a die, an integrated circuit, a package, and the like. Additionally, it will be appreciated that the device 400 may include multiple components in an integrated device, of which only a portion is illustrated. As illustrated, the device 400 may include a multiplate MIM capacitor 450, which is similar in structure to the MIM capacitors previously discussed (e.g., 150, 250, 350). The multiplate MIM capacitor 450 has a first plate 452, a second plate 454, and a third plate 456. Portions of the metal forming the first plate 452 and the third plate 456 extend up the sidewalls of the first mesa 431 and are illustrated as circular rings around the first mesa 431. The first plate 452 and the third plate 456 are separated by the first insulator 453 and the second insulator 455, which are illustrated as a combined concentric circle around the first mesa 431, but not specifically illustrated as layers between the perspective view of the first plate 452, the second plate 454, and the third plate 456. Portions of the metal forming the second plate 454 extend up the sidewalls of the second mesa 431 and is illustrated as a circular ring around the first mesa 431. The second plate 454 is disposed between the first insulator 453 and the second insulator 455, which are illustrated as concentric circles around the second mesa 432. In some aspects, as illustrated, the first plate 452, the second plate 454, and the third plate 456, extend beyond the first mesa 431 and second mesa 432, and in some aspects extend around the via 465. However, it will be appreciated that the various aspects disclosed are not limited to the illustrated configuration.

Figure 5:
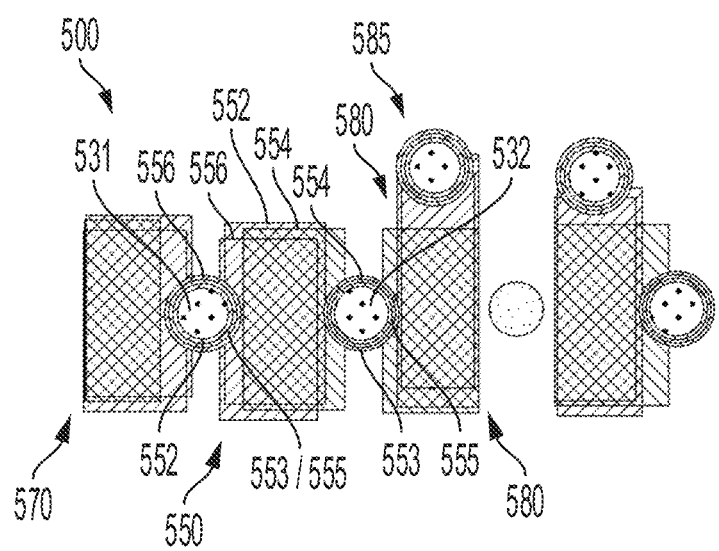
FIG. 5 illustrates a portion of a device including a MIM capacitor in accordance with one or more aspects of the disclosure.

FIG. 5 illustrates a portion of a device 500 in accordance with one or more aspects of the disclosure. In some aspects, the device 500 may be a die, an integrated circuit, a package, and the like. Additionally, it will be appreciated that the device 500 may include multiple components in an integrated device, of which only a portion is illustrated. As illustrated, the device 500 may include a multiplate MIM capacitor 550, which is similar in structure to the MIM capacitors previously discussed (e.g., 150, 250, 350). The multiplate MIM capacitor 550 has a first plate 552, a second plate 554, and a third plate 556. Portions of the metal forming the first plate 552 and the third plate 556 extend up the sidewalls of the first mesa 531 and are illustrated as circular rings around the first mesa 531. The first plate 552 and the third plate 556 are separated by the first insulator 553 and the second insulator 555, which are illustrated as a combined concentric circle around the first mesa 531. Portions of the metal forming the second plate 554 extend up the sidewalls of the second mesa 532 and is illustrated as a circular ring around the first mesa 531. The second plate 554 is disposed between the first insulator 553 and the second insulator 555, which are illustrated as concentric circles around the second mesa 532. In some aspects, as illustrated, the first plate 552, the second plate 554, and the third plate 556, may be disposed between the first mesa 531 and second mesa 532. Additional MIM capacitors (e.g., MIM capacitor 570 and MIM capacitor 580), may be coupled to one of the contact points around the mesas. For example, the MIM capacitor 570 may be coupled to the first plate 552 and the third plate 556 at the first mesa 531. Likewise, the MIM capacitor 580 may be coupled to the second plate 554 at the first mesa 532. Additionally, a contact point 585 for the first and third plates of the MIM capacitor 580 may be offset from the second mesa 532. Accordingly, it will be appreciated that the various aspects disclosed are not limited to the illustrated configurations.

Figure 6:
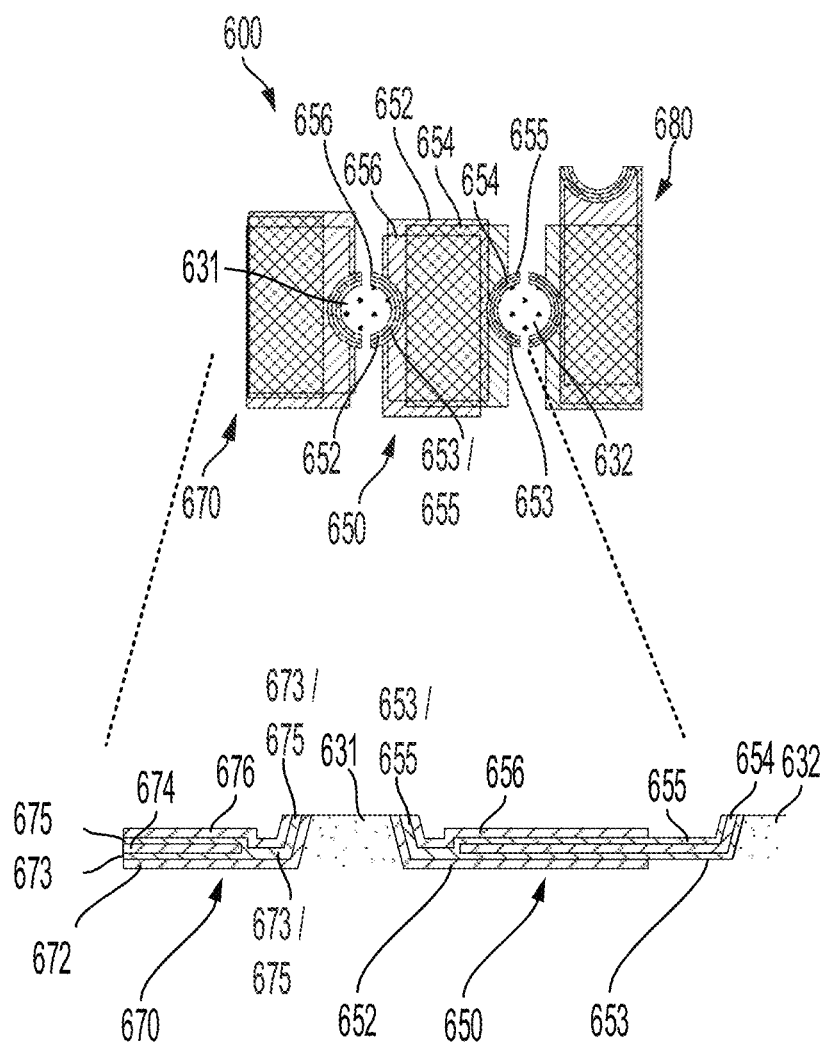
FIG. 6 illustrates a portion of a device including a MIM capacitor in accordance with one or more aspects of the disclosure.

FIG. 6 illustrates a portion of a device 600 in accordance with one or more aspects of the disclosure. In some aspects, the device 600 may be a die, an integrated circuit, a package, and the like. Additionally, it will be appreciated that the device 600 may include multiple components in an integrated device, of which only a portion is illustrated. As illustrated, the device 600 may include a multiplate MIM capacitor 650, which is similar in structure to the MIM capacitors previously discussed (e.g., 150, 250, 350). The multiplate MIM capacitor 650 has a first plate 652, a second plate 654, and a third plate 656. Portions of the metal forming the first plate 652 and the third plate 656 extend up the sidewalls of a first mesa 631 and are illustrated as semi-circular rings around the first mesa 631. The first plate 652 and the third plate 656 are separated by the first insulator 653 and the second insulator 655, which are illustrated as a combined concentric circle around the first mesa 631. It will be appreciated, as illustrated, that the first insulator 653 and the second insulator 655 may be combined at the first mesa 631, as the second plate 654 does not extend into this portion. Alternatively, in some aspects, only one of the first insulator 653 and the second insulator 655 may extend onto the first mesa 631 sidewalls. Portions of the metal forming the second plate 654 extend up the sidewalls of the second mesa 632 and is illustrated as a semi-circular ring around the first mesa 631. The second plate 654 is disposed between the first insulator 653 and the second insulator 655, which are illustrated as concentric semi-circles around the second mesa 632. In some aspects, as illustrated, the first plate 652, the second plate 654, and the third plate 656, may be disposed between the first mesa 631 and second mesa 632. Additional MIM capacitors (e.g., MIM capacitor 670 and MIM capacitor 680), may be coupled to one of the contact points around the mesas. For example, in the illustrated cross-sectional detail, the MIM capacitor 670 has a first plate 672, a second plate 674, and a third plate 676. Portions of the metal forming the first plate 672 and the third plate 676 extend up the sidewalls of the first mesa 631 and are illustrated as semi-circular rings around the first mesa 631. The first plate 672 and the third plate 676 portions on the sidewall of mesa 631 are separated by the first insulator 673 and/or the second insulator 675, which are illustrated as a combined concentric circle around the first mesa 631. In this configuration, the first plate 672 and the third plate 676 of MIM capacitor 670 are separated from the first plate 652 and the third plate 656 of MIM capacitor 650. It will be appreciated, that various plates and insulators of the MIM capacitor 680 may also be separated from the plates and insulators of MIM capacitor 650. However, in alternative configurations, one or more of the plates and insulators may be common. For example, in some aspects, the metal plates of MIM capacitor 650 and MIM capacitor 670 may be separated, but one or more of the insulators (e.g., 653/673 and 655/675) may be continuous layers between MIM capacitor 650 and MIM capacitor 670. In a further alternative aspects, the MIM capacitor 650 may be rotated by 180 degree (in top drawing) or horizontally flipped (in lower drawing). In this configuration, the left part of mesa 631 (not illustrated) will have the first and third metal plates and the right part of mesa 631 (not illustrated) will have second metal plates, instead of the mesa 631 (as illustrated) having the first and third metal plates on both its left and right parts. Accordingly, it will be appreciated that the various configurations will be appreciated by those skilled in the art and the various aspects disclosed are not limited to the illustrated configurations.

Figure 7:
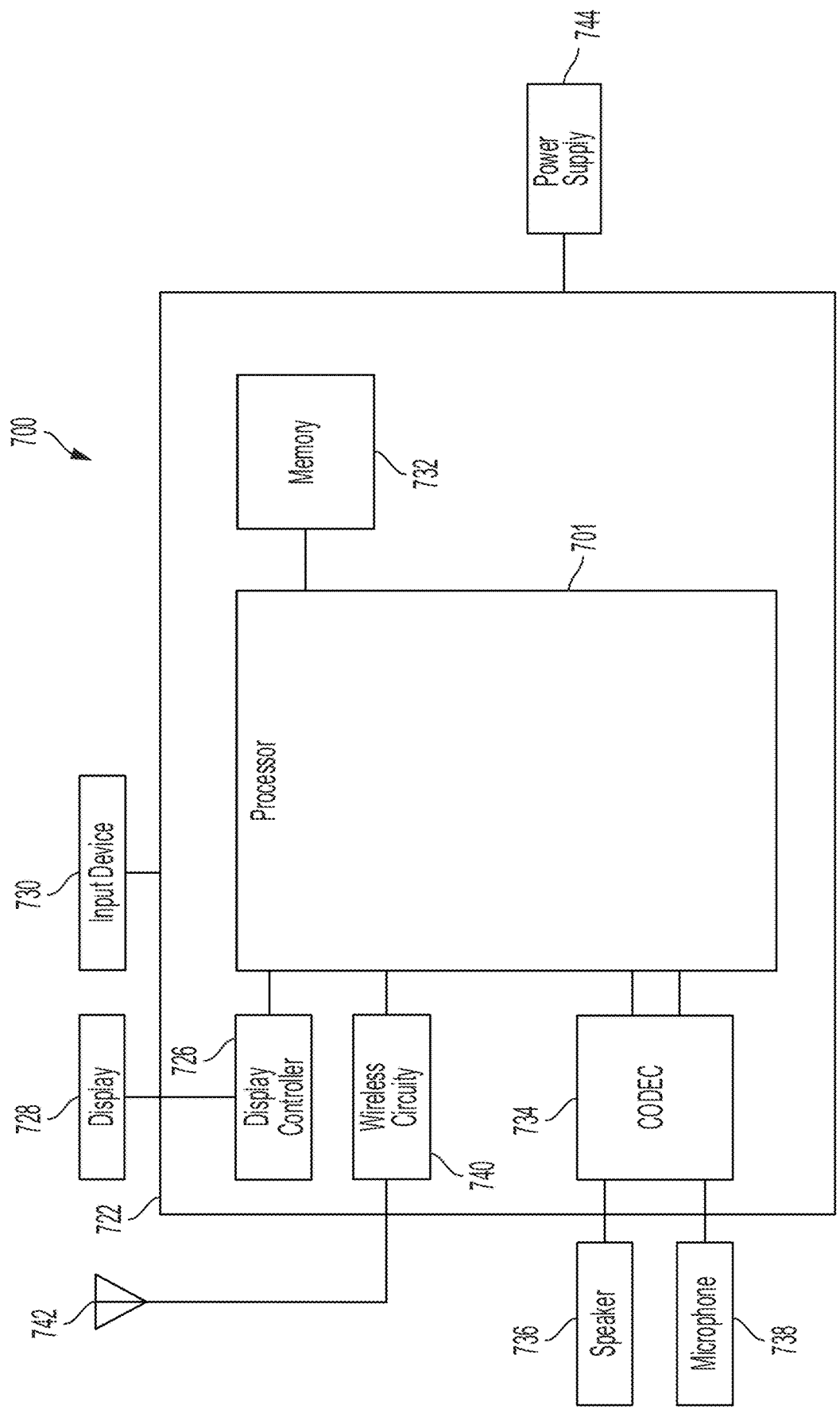
FIG. 7 illustrates a mobile device in accordance with at least one aspect of the disclosure.

FIG. 7 illustrates an exemplary mobile device in accordance with some examples of the disclosure. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless circuits 740 (which may include a modem, RF circuitry, filters, etc., which may be implemented using one or more devices including a multiplate MIM capacitor, as disclosed herein) coupled to wireless antenna 742 and to processor 701.

In a particular aspect, where one or more of the above-mentioned blocks are present, processor 701, display controller 726, memory 732, CODEC 634, and wireless circuits 740 can be included in a system-in-package or system-on-chip device 722 which may be implemented using the which may be implemented using one or more devices including a MIM capacitor in a backside BEOL metallization, as disclosed herein. Input device 730 (e.g., physical or virtual keyboard), power supply 744 (e.g., buried), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a mobile device 700, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
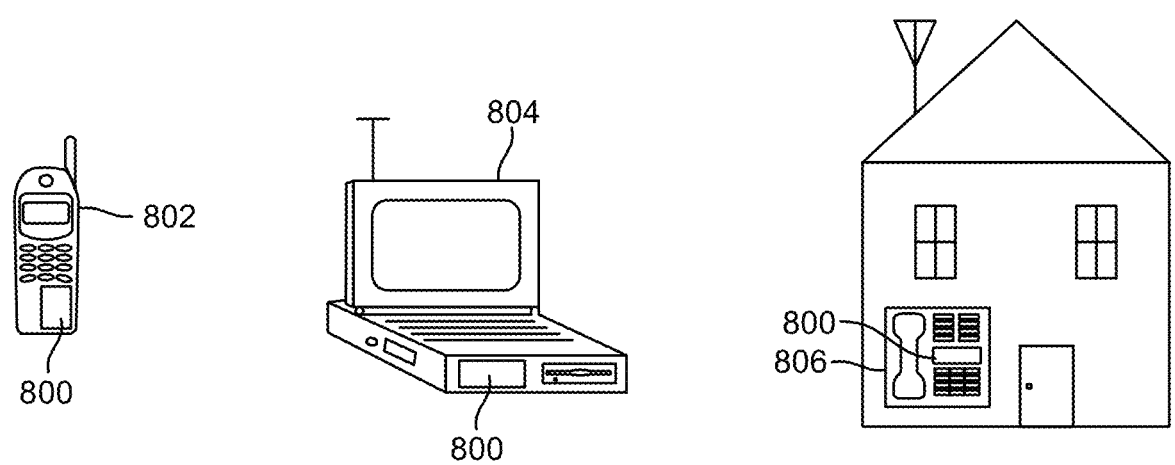
FIG. 8 illustrates various electronic devices which may utilize one or more aspects of the disclosure.

FIG. 8 illustrates various electronic devices that may be integrated with any of the aforementioned integrated device or semiconductor device accordance with various examples of the disclosure. For example, a mobile phone device 802, a laptop computer device 804, and a fixed location terminal device 806 may each be considered generally user equipment (UE) and may include a device 800 including a MIM capacitor in a backside BEOL metallization as described herein. The device 800 may be, for example, any of the integrated circuits, dies, integrated devices, integrated device packages, integrated circuit devices, device packages, integrated circuit (IC) packages, package-on-package devices described herein. The devices 802, 804, 806 illustrated in FIG. 8 are merely exemplary. Other electronic devices may also feature the device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

Figure 9:
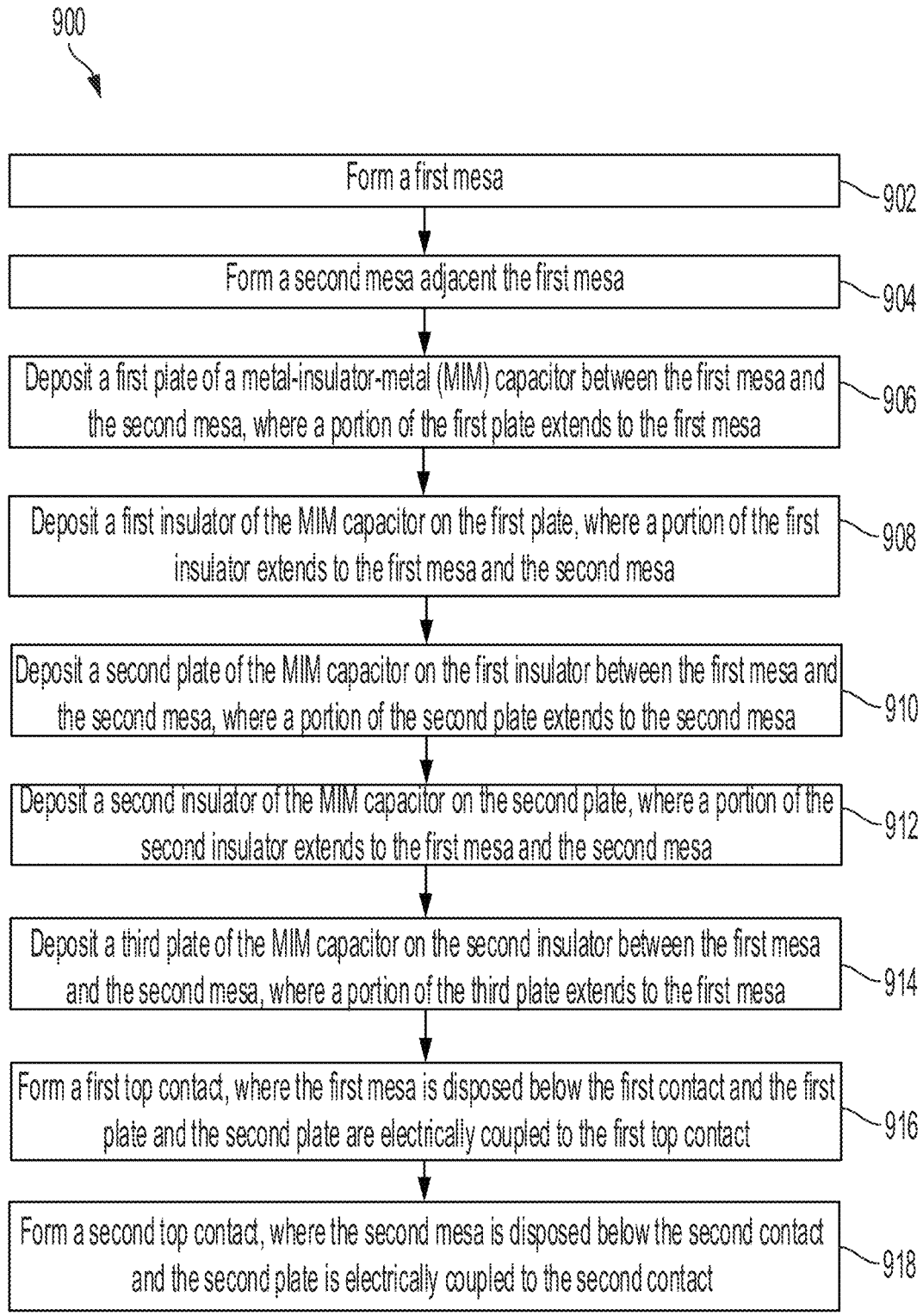
FIG. 9 illustrates a flow chart for fabricating a device including a MIM capacitor in accordance with one or more aspects of the disclosure.

It will be appreciated from the foregoing that there are various methods for fabricating devices including a multi-plate MIM capacitor as disclosed herein. FIG. 9 illustrates a flowchart of an example method 900 for fabricating a device including a metal-insulator-metal (MIM) capacitor in accordance with at least one aspect disclosed. In block 902, the fabrication process can include forming a first mesa (e.g., 131, 231). In block 904, the fabrication process can further include forming a second top contact (e.g., 120, 220), adjacent the first top contact. In block 906, the fabrication process can include depositing a first plate of a metal-insulator-metal (MIM) capacitor (e.g., 150, 250) between the first mesa and the second mesa, where a portion of the first plate extends to the first mesa. In block 908, the fabrication process can include depositing a first insulator (e.g., 153, 253) of the MIM capacitor on the first plate, where a portion of the first insulator extends to the first mesa and the second mesa. In block 910, the fabrication process can include depositing a second plate (e.g., 154, 254) of the MIM capacitor disposed on the first insulator, where a portion of the second plate extends to the second mesa. In block 912, the fabrication process can include depositing a second insulator (e.g., 155, 255) of the MIM capacitor on the second plate, where a portion of the second insulator extends to the first mesa and the second mesa. In block 914, the fabrication process can include depositing a third plate (e.g., 156, 256) of the MIM capacitor on the second insulator between the first mesa and the second mesa, wherein a portion of the third plate extends to the first mesa. In block 916, the fabrication process can include forming a first top contact, where the first mesa is disposed below the first contact and the first plate and the second plate are electrically coupled to the first top contact. In block 918, the fabrication process can forming a second top contact, wherein the second mesa is disposed below the second contact and the second plate is electrically coupled to the second contact.

It will be appreciated from the foregoing disclosure that additional processes for fabricating the various aspects disclosed herein will be apparent to those skilled in the art and a literal rendition of the processes discussed above will not be provided or illustrated in the included drawings.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature, or function or incorporated in several components, processes, or functions. Additional elements, components, processes, and/or functions may also be added without departing from the disclosure. It should also be noted that FIGS. 1-9 and corresponding description in the present disclosure are not limited to dies and/or integrated circuits (ICs). In some implementations, FIGS. 1-9 and its corresponding description may be used to manufacture, create, provide, and/or produce integrated devices. In some implementations, a device may include a die, an integrated device, a die package, an integrated circuit (IC), a device package, an IC package, a wafer, a semiconductor device, a package on package (PoP) device, and/or an interposer.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising: a first top contact; a second top contact, adjacent the first top contact; a first mesa disposed below the first top contact; a second mesa disposed below the second top contact; a first plate of a metal-insulator-metal (MIM) capacitor disposed below the first top contact and electrically coupled to the first top contact; a first insulator of the MIM capacitor disposed on the first plate; a second plate of the MIM capacitor disposed on the first insulator and electrically coupled to the second top contact; a second insulator of the MIM capacitor disposed on the second plate; and a third plate of the MIM capacitor disposed on the second insulator and electrically coupled to the first top contact.

Clause 2. The apparatus of clause 1, further comprising: a first partial via disposed between the first top contact and the first mesa, wherein the first plate and the third plate are electrically coupled to the first top contact through the first partial via; and a second partial via disposed between the second top contact and the second mesa, wherein the second plate is electrically coupled to the second top contact through the second partial via.

Clause 3. The apparatus of clause 1, wherein the first top contact is directly disposed on the first mesa and the second top contact is directly disposed on the second mesa.

Clause 4. The apparatus of any of clauses 1 to 3, wherein the first mesa and the second mesa are formed in a first inter-metal dielectric (IMD) layer.

Clause 5. The apparatus of clause 4, further comprising: a second inter-metal dielectric (IMD) layer, wherein the first top contact and the second top contact are at least partially disposed in the second IMD layer.

Clause 6. The apparatus of clause 5, wherein the first top contact and the second top contact are in a same metal layer in the second IMD layer.

Clause 7. The apparatus of clause 6, further comprising" a lower metal layer, wherein the first IMD layer is disposed on the lower metal layer.

Clause 8. The apparatus of any of clauses 4 to 7, wherein the first insulator comprises a high dielectric constant (high-k) dielectric material, and wherein the first IMD layer comprises a low dielectric constant (low-k) dielectric material.

Clause 9. The apparatus of any of clauses 5 to 8, wherein the second IMD layer comprises a low dielectric constant (low-k) dielectric material.

Clause 10. The apparatus of any of clauses 1 to 9, wherein the first plate, the second plate, the third plate, the first insulator and the second insulator are disposed between the first top contact and the second top contact.

Clause 11. The apparatus of any of clauses 1 to 10, wherein the first plate and the third plate are coupled to a first power connection, and the second plate is coupled to a second power connection.

Clause 12. The apparatus of clause 11, wherein the first power connection is configured to be at a positive potential and wherein the second power connection is configured to be at a negative potential or ground.

Clause 13. The apparatus of any of clauses 1 to 12, further comprising: a second MIM capacitor, wherein the second MIM capacitor has a second plate disposed between a first plate and a third plate and wherein the first plate and the third plate are coupled to the first top contact.

Clause 14. The apparatus of any of clauses 1 to 13, further comprising: a third MIM capacitor, wherein the third MIM capacitor has a second plate disposed between a first plate and a third plate and wherein the second plate is coupled to the second top contact.

Clause 15. The apparatus of any of clauses 1 to 14, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station and a device in an automotive vehicle.

Clause 16. A method of fabricating an apparatus, the method comprising: forming a first mesa; forming a second mesa adjacent the first mesa; depositing a first plate of a metal-insulator-metal (MIM) capacitor between the first mesa and the second mesa, wherein a portion of the first plate extends to the first mesa; depositing a first insulator of the MIM capacitor on the first plate, wherein a portion of the first insulator extends to the first mesa and the second mesa; depositing a second plate of the MIM capacitor on the first insulator between the first mesa and the second mesa, wherein a portion of the second plate extends to the second mesa; depositing a second insulator of the MIM capacitor on the second plate, wherein a portion of the second insulator extends to the first mesa and the second mesa; depositing a third plate of the MIM capacitor on the second insulator between the first mesa and the second mesa, wherein a portion of the third plate extends to the first mesa; forming a first top contact, wherein the first mesa is disposed below the first contact and the first plate and the second plate are electrically coupled to the first top contact; and forming a second top contact, wherein the second mesa is disposed below the second contact and the second plate is electrically coupled to the second contact.

Clause 17. The method of clause 16, further comprising: disposing a first partial via between the first top contact and the first mesa, wherein the first plate and the third plate are electrically coupled to the first top contact through the first partial via; and disposing a second partial via between the second top contact and the second mesa, wherein the second plate is electrically coupled to the second top contact through the second partial via.

Clause 18. The method of clause 16, wherein the first top contact is directly disposed on the first mesa and the second top contact is directly disposed on the second mesa.

Clause 19. The method of any of clauses 16 to 18, wherein the first mesa and the second mesa are formed in a first inter-metal dielectric (IMD) layer.

Clause 20. The method of clause 19, further comprising: forming a second inter-metal dielectric (IMD) layer, wherein the first top contact and the second top contact are at least partially disposed in the second IMD layer.

Clause 21. The method of clause 20, wherein the first top contact and the second top contact are in a same metal layer in the second IMD layer.

Clause 22. The method of clause 21, further comprising" disposing a lower metal layer, wherein the first IMD layer is on the lower metal layer.

Clause 23. The method of any of clauses 19 to 22, wherein the first insulator comprises a high dielectric constant (high-k) dielectric material, and wherein the first IMD layer comprises a low dielectric constant (low-k) dielectric material.

Clause 24. The method of any of clauses 20-23, wherein the second IMD layer comprises a low dielectric constant (low-k) dielectric material.

Clause 25. The method of any of clauses 16 to 24, wherein the first plate, the second plate, the third plate, the first insulator and the second insulator are disposed between the first top contact and the second top contact.

Clause 26. The method of any of clauses 16 to 25, wherein the first plate and the third plate are coupled to a first power connection, and the second plate is coupled to a second power connection.

Clause 27. The apparatus of clause 26, wherein the first power connection is configured to be at a positive potential and wherein the second power connection is configured to be at a negative potential or ground.

Clause 28. The method of any of clauses 16 to 27, further comprising: forming a second MIM capacitor, wherein the second MIM capacitor has a second plate disposed between a first plate and a third plate and wherein the first plate and the third plate are coupled to the first top contact.

Clause 29. The method of any of clauses 16 to 28, further comprising: forming a third MIM capacitor, wherein the third MIM capacitor has a second plate disposed between a first plate and a third plate and wherein the second plate is coupled to the second top contact.

Clause 30. The method of any of clauses 16 to 29, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station and a device in an automotive vehicle.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising:
    a first top contact;
    a second top contact, adjacent the first top contact;
    a first mesa disposed below the first top contact;
    a second mesa disposed below the second top contact, wherein the first mesa and the second mesa comprise dielectric material;
    a first plate of a metal-insulator-metal (MIM) capacitor disposed below the first top contact and electrically coupled to the first top contact;
    a first insulator of the MIM capacitor disposed on the first plate;
    a second plate of the MIM capacitor disposed on the first insulator and electrically coupled to the second top contact;
    a second insulator of the MIM capacitor disposed on the second plate;
    a third plate of the MIM capacitor disposed on the second insulator and electrically coupled to the first top contact; and
    a second MIM capacitor, wherein the second MIM capacitor has a second plate disposed between a first plate and a third plate and wherein the first plate and the third plate are coupled to the first top contact.

2. The apparatus of claim 1, further comprising:
    a first partial via disposed between the first top contact and the first mesa, wherein the first plate and the third plate are electrically coupled to the first top contact through the first partial via; and
    a second partial via disposed between the second top contact and the second mesa, wherein the second plate is electrically coupled to the second top contact through the second partial via.

3. The apparatus of claim 1, wherein the first top contact is disposed on the first mesa and the second top contact is disposed on the second mesa.

4. The apparatus of claim 1, wherein the first mesa and the second mesa are formed in a first inter-metal dielectric (IMD) layer.

5. The apparatus of claim 4, further comprising:
    a second inter-metal dielectric (IMD) layer, wherein the first top contact and the second top contact are at least partially disposed in the second IMD layer.

6. The apparatus of claim 5, wherein the first top contact and the second top contact are in a same metal layer in the second IMD layer.

7. The apparatus of claim 6, further comprising:
    a lower metal layer, wherein the first IMD layer is disposed on the lower metal layer.

8. The apparatus of claim 4, wherein the first insulator comprises a high dielectric constant (high-k) dielectric material, and wherein the first IMD layer comprises a low dielectric constant (low-k) dielectric material.

9. The apparatus of claim 5, wherein the second IMD layer comprises a low dielectric constant (low-k) dielectric material.

10. The apparatus of claim 1, wherein the first plate, the second plate, the third plate, the first insulator and the second insulator are disposed between the first top contact and the second top contact.

11. The apparatus of claim 1, wherein the first plate and the third plate are coupled to a first power connection, and the second plate is coupled to a second power connection.

12. The apparatus of claim 11, wherein the first power connection is configured to be at a positive potential and wherein the second power connection is configured to be at a negative potential or ground.

13. The apparatus of claim 1, further comprising:
a third MIM capacitor, wherein the third MIM capacitor has a second plate disposed between a first plate and a third plate and wherein the second plate is coupled to the second top contact.

14. The apparatus of claim 1, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station and a device in an automotive vehicle.

15. The apparatus of claim 1, wherein the first mesa or the second mesa has tapered sides.

16. The apparatus of claim 15, wherein the first mesa or the second mesa is formed as a conical structure.

17. An apparatus comprising:
a first top contact;
a second top contact, adjacent the first top contact;
a first mesa disposed below the first top contact;
a second mesa disposed below the second top contact, wherein the first mesa and the second mesa comprise dielectric material;
a first plate of a metal-insulator-metal (MIM) capacitor disposed below the first top contact and electrically coupled to the first top contact;
a first insulator of the MIM capacitor disposed on the first plate;
a second plate of the MIM capacitor disposed on the first insulator and electrically coupled to the second top contact;
a second insulator of the MIM capacitor disposed on the second plate;
a third plate of the MIM capacitor disposed on the second insulator and electrically coupled to the first top contact; and
a second MIM capacitor, wherein the second MIM capacitor has a second plate disposed between a first plate and a third plate and wherein the second plate is coupled to the second top contact.

18. The apparatus of claim 17, further comprising:
a first partial via disposed between the first top contact and the first mesa, wherein the first plate and the third plate are electrically coupled to the first top contact through the first partial via; and
a second partial via disposed between the second top contact and the second mesa, wherein the second plate is electrically coupled to the second top contact through the second partial via.

19. The apparatus of claim 17, wherein the first top contact is disposed on the first mesa and the second top contact is disposed on the second mesa.

20. The apparatus of claim 17, wherein the first mesa and the second mesa are formed in a first inter-metal dielectric (IMD) layer.

21. The apparatus of claim 20, further comprising:
a second inter-metal dielectric (IMD) layer, wherein the first top contact and the second top contact are at least partially disposed in the second IMD layer.

22. The apparatus of claim 21, wherein the first top contact and the second top contact are in a same metal layer in the second IMD layer.

23. The apparatus of claim 22, further comprising:
a lower metal layer, wherein the first IMD layer is disposed on the lower metal layer.

24. The apparatus of claim 20, wherein the first insulator comprises a high dielectric constant (high-k) dielectric material, and wherein the first IMD layer comprises a low dielectric constant (low-k) dielectric material.

25. The apparatus of claim 21, wherein the second IMD layer comprises a low dielectric constant (low-k) dielectric material.

26. The apparatus of claim 17, wherein the first plate, the second plate, the third plate, the first insulator and the second insulator are disposed between the first top contact and the second top contact.

27. The apparatus of claim 17, wherein the first plate and the third plate are coupled to a first power connection, and the second plate is coupled to a second power connection.

28. The apparatus of claim 27, wherein the first power connection is configured to be at a positive potential and wherein the second power connection is configured to be at a negative potential or ground.

29. The apparatus of claim 17, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station and a device in an automotive vehicle.

30. The apparatus of claim 1, wherein the first mesa or the second mesa has a structure that when viewed from the top is circular, trapezoidal, rectangular, square, or oval.

* * * * *